US012791947B2

(12) United States Patent
Ten Berge et al.

(10) Patent No.: US 12,791,947 B2
(45) Date of Patent: Nov. 10, 2026

(54) METHOD FOR CONTROLLING A MANUFACTURING PROCESS AND ASSOCIATED APPARATUSES

(71) Applicant: ASML NETHERLANDS B.V., Veldhoven (NL)

(72) Inventors: Peter Ten Berge, Eindhoven (NL); Steven Erik Steen, Veldhoven (NL); Pieter Gerardus Jacobus Smorenberg, Rotterdam (NL); Khalid Elbattay, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 18/242,842

(22) Filed: Sep. 6, 2023

(65) Prior Publication Data

US 2024/0045340 A1 Feb. 8, 2024

Related U.S. Application Data

(63) Continuation of application No. 17/801,381, filed as application No. PCT/EP2021/052492 on Feb. 3, 2021, now Pat. No. 11,768,441.

(30) Foreign Application Priority Data

Mar. 3, 2020 (EP) .................................... 20160538
Mar. 19, 2020 (EP) .................................... 20164221

(51) Int. Cl.
*G03F 7/00* (2006.01)

(52) U.S. Cl.
CPC ................................ *G03F 7/70525* (2013.01)

(58) Field of Classification Search
CPC ............. G03F 7/70525; G03F 7/70633; H01L 21/2007; H01L 22/20; H01L 2224/75753;
(Continued)

(56) References Cited

U.S. PATENT DOCUMENTS 9,478,496 B1 10/2016 Lin
10,529,694 B2 1/2020 Guo
(Continued)

FOREIGN PATENT DOCUMENTS

CN 109920751 6/2019
WO 2009078708 6/2009
(Continued)

OTHER PUBLICATIONS

International Search Report and Written Opinion issued in corresponding PCT Patent Application No. PCT/EP2021/052492, dated Apr. 29, 2021.

(Continued)

*Primary Examiner* — Deoram Persaud
(74) *Attorney, Agent, or Firm* — Pillsbury Winthrop Shaw Pittman, LLP

(57) ABSTRACT

A method for controlling a process of manufacturing semiconductor devices, the method including: obtaining a first control grid associated with a first lithographic apparatus used for a first patterning process for patterning a first substrate; obtaining a second control grid associated with a second lithographic apparatus used for a second patterning process for patterning a second substrate; based on the first control grid and second control grid, determining a common control grid definition for a bonding step for bonding the first substrate and second substrate to obtain a bonded substrate; obtaining bonded substrate metrology data including data relating to metrology performed on the bonded substrate; and determining a correction for performance of the bonding step based on the bonded substrate metrology data, the determining a correction including determining a co-optimized correction for the bonding step and for the first patterning process and/or second patterning process.

20 Claims, 4 Drawing Sheets

(58) Field of Classification Search
CPC ....... H01L 2224/75901; H01L 2224/80; H01L 2224/8013; H01L 2224/80132; H01L 2224/94; H01L 24/75; H01L 24/80; H01L 24/94; H01L 21/185; H01L 2223/54426; H01L 2223/54453; H01L 23/544; H01L 2924/00014
See application file for complete search history.

(56) References Cited

U.S. PATENT DOCUMENTS

| | | | | |
|---|---|---|---|---|
| 10,991,685 | B2 | 4/2021 | Hisada et al. | |
| 11,335,607 | B2 * | 5/2022 | Ip | G06F 30/27 |
| 2002/0158193 | A1 | 10/2002 | Sezginer et al. | |
| 2006/0033921 | A1 | 2/2006 | Den Boef et al. | |
| 2006/0066855 | A1 | 3/2006 | Boef et al. | |
| 2006/0121373 | A1 | 6/2006 | Yang et al. | |
| 2007/0252994 | A1 * | 11/2007 | Bijnen | H01L 21/681 356/401 |
| 2008/0083818 | A1 * | 4/2008 | Best | B23K 31/02 228/103 |
| 2009/0130821 | A1 | 5/2009 | Cox et al. | |
| 2010/0201963 | A1 | 8/2010 | Cramer et al. | |
| 2011/0027704 | A1 | 2/2011 | Cramer et al. | |
| 2011/0043791 | A1 | 2/2011 | Smilde et al. | |
| 2011/0065214 | A1 | 3/2011 | Farooq et al. | |
| 2011/0102753 | A1 | 5/2011 | Van De Kerkhof et al. | |
| 2012/0044470 | A1 | 2/2012 | Smilde et al. | |
| 2012/0123581 | A1 | 5/2012 | Smilde et al. | |
| 2013/0258310 | A1 | 10/2013 | Smilde et al. | |
| 2013/0271740 | A1 | 10/2013 | Quintanilha | |
| 2014/0002822 | A1 * | 1/2014 | Chen | H01L 23/544 257/E23.179 |
| 2014/0356981 | A1 | 12/2014 | Hubbard et al. | |
| 2015/0072444 | A1 | 3/2015 | La Tulipe, Jr. et al. | |
| 2015/0214082 | A1 * | 7/2015 | Huang | H01L 21/76251 438/457 |
| 2017/0038562 | A1 | 2/2017 | Georgiev | |
| 2017/0243853 | A1 * | 8/2017 | Huang | H01L 21/681 |
| 2018/0252998 | A1 | 9/2018 | Ten Berge et al. | |
| 2019/0094682 | A1 * | 3/2019 | Liu | G03F 1/62 |
| 2019/0355698 | A1 * | 11/2019 | Guo | B81C 3/004 |
| 2020/0286853 | A1 * | 9/2020 | Kawadahara | B81C 1/00357 |
| 2021/0208512 | A1 * | 7/2021 | Calado | G03F 7/70633 |
| 2023/0030116 | A1 * | 2/2023 | Zach | G03F 7/70516 |

FOREIGN PATENT DOCUMENTS

| | | |
|---|---|---|
| WO | 2009106279 | 9/2009 |
| WO | 2011101187 | 8/2011 |
| WO | 2013178422 | 12/2013 |
| WO | 2015185166 | 12/2015 |
| WO | 2019110261 | 6/2019 |

OTHER PUBLICATIONS

Office Action issued in corresponding Korean Patent Application No. 10-2025-7017798, dated Jan. 21, 2026.

* cited by examiner

METHOD FOR CONTROLLING A MANUFACTURING PROCESS AND ASSOCIATED APPARATUSES

This application is a continuation of U.S. patent application Ser. No. 17/801,381, filed Aug. 22, 2022, which is the U.S. national phase entry of PCT Patent Application No. PCT/EP2021/052492, which was filed on Feb. 3, 2021, which claims priority of European Patent Application No. 20160538.3, which was filed on Mar. 3, 2020, and of European Patent Application No. 20164221.2, which was filed on Mar. 19, 2020, each of the foregoing applications is incorporated herein its entirety by reference.

FIELD

The present description relates to methods and apparatus for applying patterns to substrates and subsequently bonding two or more substrates together in a lithographic manufacturing process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 μm by 40 μm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

Process control methods are used in the manufacture of integrated devices to monitor and control the processes of application of a pattern on a substrate or measurement of such a pattern. Such process control techniques are typically performed to obtain corrections for control of the process. Subsequently, it is sometimes required (for certain devices) to bond substrates together. Bonding processes include die-to-die, die-to-wafer and wafer-to-wafer. Wafer-to-wafer bonding, where whole wafers are permanently bonded together prior to dicing, has the potential of providing a high accuracy and high throughput bonding solution.

It would be desirable to improve process control methods in the manufacture of integrated devices.

SUMMARY

In an aspect, there is provided a method for controlling a process of manufacturing semiconductor devices, the method comprising: obtaining a first control grid associated with a first lithographic apparatus used for a first patterning process for patterning a first substrate; obtaining a second control grid associated with a second lithographic apparatus used for a second patterning process for patterning a second substrate; based on the first control grid and second control grid, determining a common control grid definition for a bonding step for bonding the first substrate and second substrate to obtain a bonded substrate; obtaining bonded substrate metrology data comprising data relating to metrology performed on the bonded substrate; and determining a correction for performance of the bonding step on subsequent substrates based on the bonded substrate metrology data, wherein the determining a correction comprises determining a co-optimized correction for the bonding step and for one or both of the first patterning process and/or second patterning process.

In an aspect, there is provided a lithographic apparatus which is configured to provide product structures to a substrate in a lithographic process, the lithographic apparatus comprising a processor operable to optimize control of the lithographic apparatus during the lithographic process by performing the method of the first aspect.

In an aspect, there is provided a computer program comprising program instructions operable to perform the method of the first aspect when run on a suitable apparatus.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
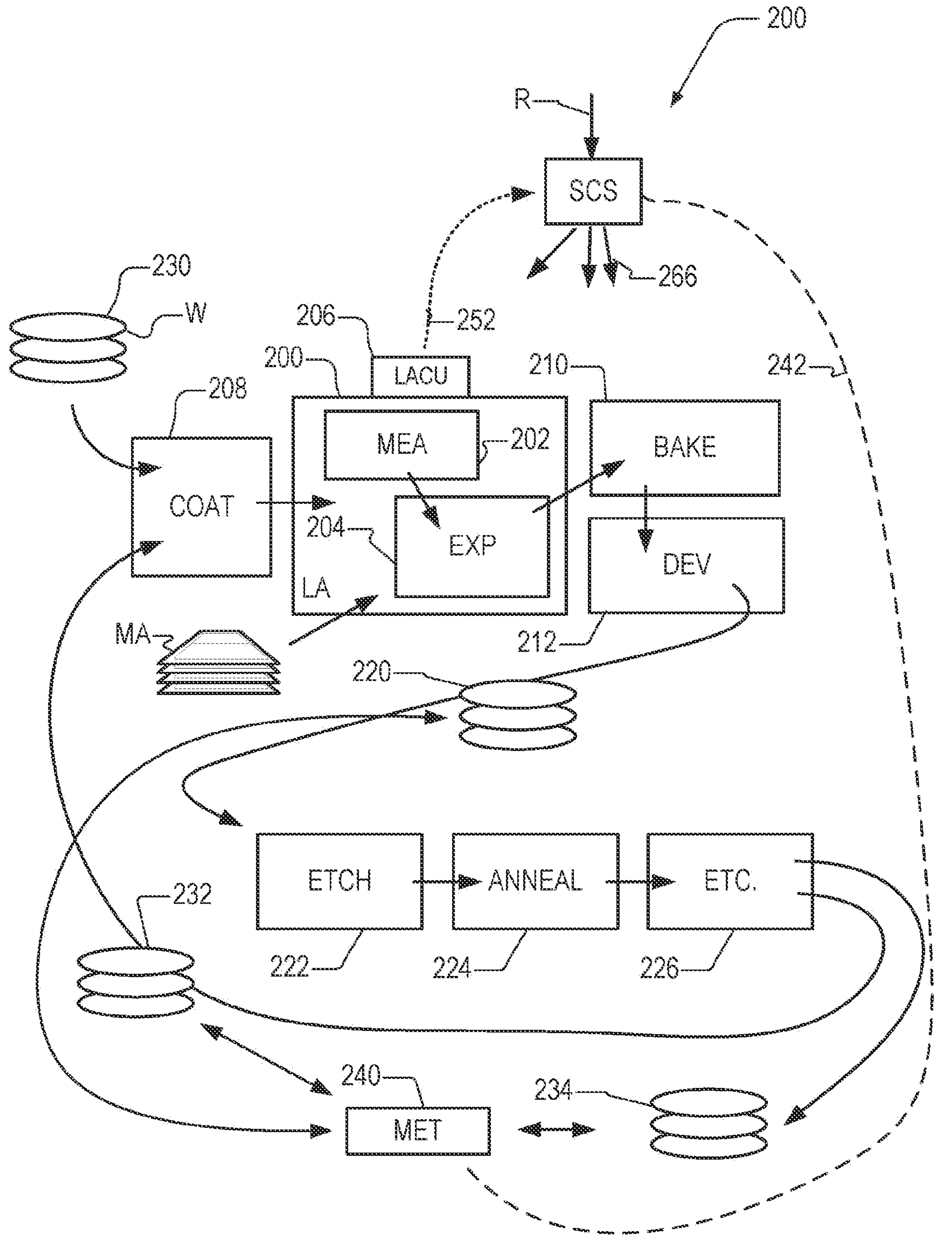
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

Figure 2A:
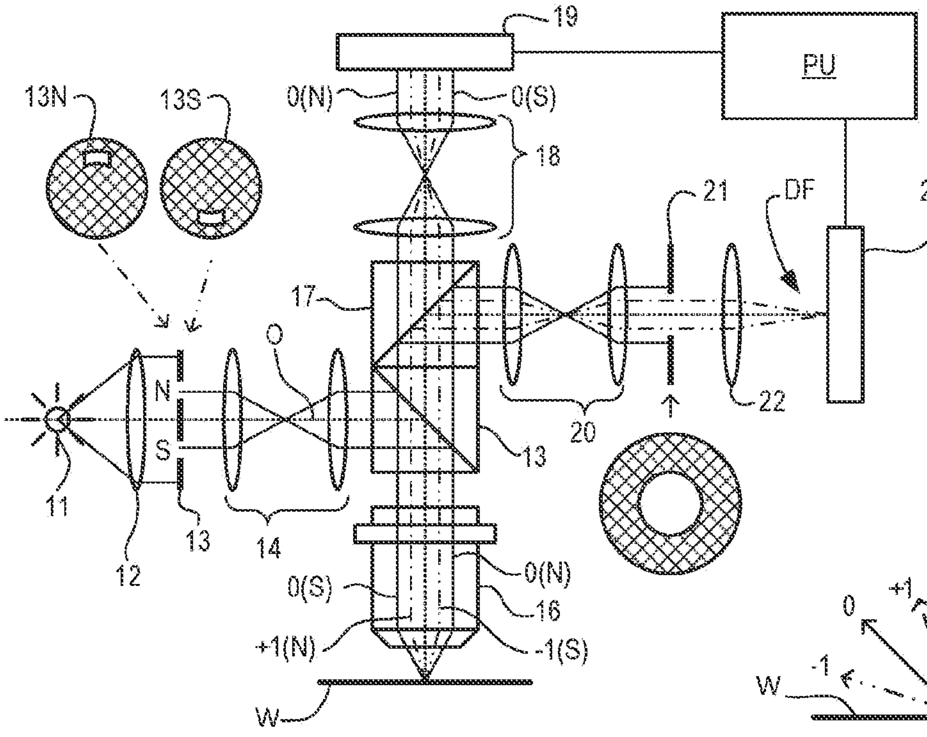
FIGS. 2(*a*) and 2(*b*) comprise schematic diagrams related to a scatterometer for use in measuring targets according to embodiments of the invention.
Figure 2B:
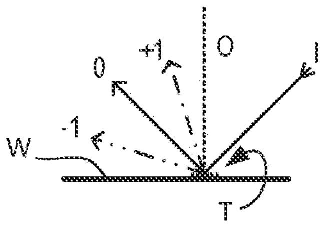

A metrology apparatus suitable for use in embodiments of the invention is shown in FIG. 2(*a*). A target T and diffracted rays of measurement radiation used to illuminate the target are illustrated in more detail in FIG. 2(*b*). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 2(*b*), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(*a*) and 2(*b*) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(*a*), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for many measurement purposes such as reconstruction used in methods described herein. The pupil plane image can also be used for focusing the metrology apparatus and/or normalizing intensity measurements of the first order beam.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 2 are purely examples. In an embodiment, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 2) can be used in measurements, instead of or in addition to the first order beams.

The target T may comprise a number of gratings, which may have differently biased overlay offsets in order to facilitate measurement of overlay between the layers in which the different parts of the composite gratings are formed. The gratings may also differ in their orientation, so as to diffract incoming radiation in X and Y directions. In one example, a target may comprise two X-direction gratings with biased overlay offsets +d and −d, and Y-direction gratings with biased overlay offsets +d and −d. Separate images of these gratings can be identified in the image captured by sensor 23. Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process Various techniques may be used to improve the accuracy of reproduction of patterns onto a substrate. Accurate reproduction of patterns onto a substrate is not the only concern in the production of ICs. Another concern is the yield, which generally measures how many functional devices a device manufacturer or a device manufacturing process can produce per substrate. Various approaches can be employed to enhance the yield. One such approach attempts to make the production of devices (e.g., imaging a portion of a design layout onto a substrate using a lithographic apparatus such as a scanner) more tolerant to perturbations of at least one of the processing parameters during processing a substrate, e.g., during imaging of a portion of a design layout onto a substrate using a lithographic apparatus. The concept of overlapping process window (OPW) is a useful tool for this approach. The production of devices (e.g., ICs) may include other steps such as substrate measurements before, after or during imaging, loading or unloading of the substrate, loading or unloading of a patterning device, positioning of a die underneath the projection optics before exposure, stepping from one die to another, etc. Further, various patterns on a patterning device may have different process windows (i.e., a space of processing parameters under which a pattern will be produced within specification). Examples of pattern specifications that relate to a potential systematic defect include checks for necking, line pull back, line thinning, CD, edge placement, overlapping, resist top loss, resist undercut and/or bridging. The process window of all or some (usually patterns within a particular area) of the patterns on a patterning device may be obtained by merging (e.g., overlapping) process windows of each individual pattern. The process window of these patterns is thus called an overlapping process window. The boundary of the OPW may contain boundaries of process windows of some of the individual patterns. In another words, these individual patterns limit the OPW. These individual patterns can be referred to as "hot spots" or "process window limiting patterns (PWLPs)," which are used interchangeably herein. When controlling a lithography process, it is possible, and typically economical, to focus on the hot spots. When the hot spots are not defective, it is likely that all the patterns are not defective. The imaging becomes more tolerant to perturbations when values of the processing parameters are closer to the OPW if the values of the processing parameters are outside the OPW, or when the values of the processing parameters are farther away from the boundary of the OPW if the values of the processing parameters are inside the OPW.

The values of the processing parameters may be selected such that they stay away from the boundary of the OPW or the fitted OPW, in order to decrease the chance that the processing parameters shift outside the OPW and thereby cause defects and decrease the yield. One approach of selecting the values of the processing parameters includes, before actual imaging, (1) optimizing the lithographic apparatus (e.g., optimizing the source and projection optics) and optimizing the design layout, (2) determining the OPW or fitted OPW (e.g., by simulation), and (3) determining a point in the space of the processing parameters (i.e., determining the values of the processing parameters) that is as far away as possible from the boundary of the OPW or fitted OPW (this point may be called the "center" of the OPW or fitted OPW).

During or before the actual imaging, the processing parameters may have a perturbation that causes them to deviate from the point that is as far away as possible from the boundary of the OPW or fitted OPW. For example, the focus may change due to topography of a substrate to be exposed, drift in the substrate stage, deformation of the projection optics, etc.; the dose may change to due drift in the source intensity, dwell time, etc. The perturbation may be large enough to cause processing parameters to be outside the OPW, and thus may lead to defects. Various techniques may be used to identify a processing parameter that is perturbed and to correct that processing parameter. For example, if the focus is perturbed, e.g., because an area of the substrate that is slightly raised from the rest of the substrate is being exposed, the substrate stage may be moved or tilted to compensate for the perturbation.

Control of the lithographic process are typically based on measurements fed back or fed forward and then modelled using, for example interfield (across-substrate fingerprint) or intrafield (across-field fingerprint) models. Within a die, there may be separate functional areas such as memory areas, logic areas, contact areas etc. Each different functional area, or different functional area type may have a different process window, each with a different processes window center. For example, different functional area types may have different heights, and therefore different best focus settings. Also, different functional area types may have different structure complexities and therefore different focus tolerances (focus process windows) around each best focus. However, each of these different functional areas will typically be formed using the same focus (or dose or position etc.) setting due to control grid resolution limitations.

Figure 3:
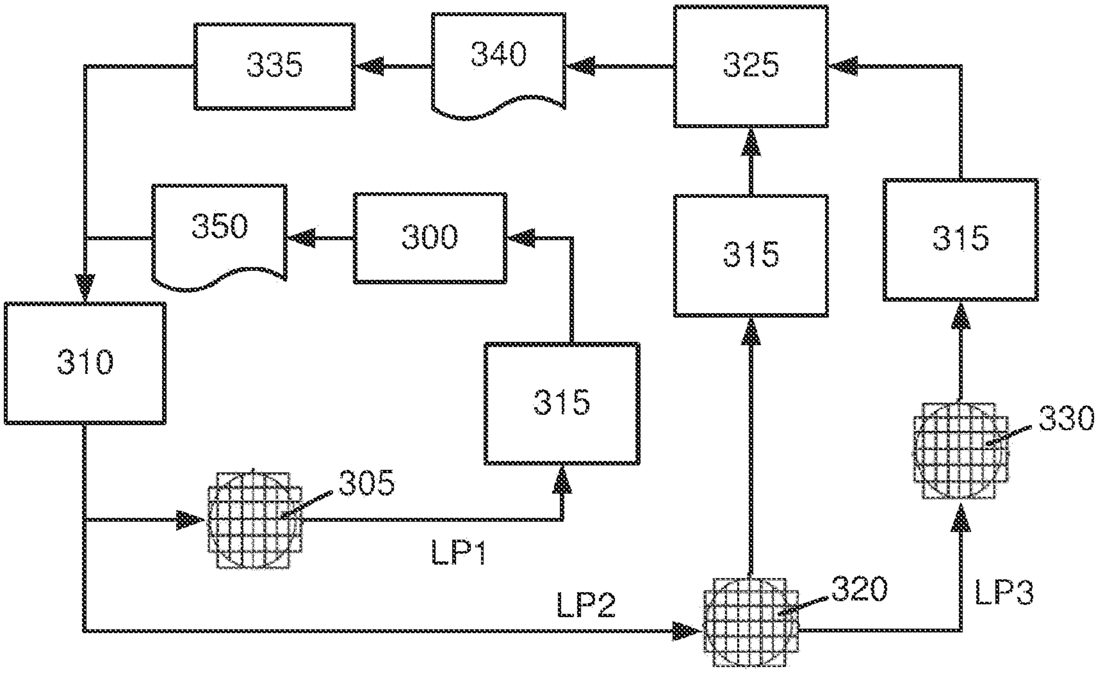
FIG. 3 is a schematic overview of control mechanisms in a lithographic process utilizing a scanner stability module.

FIG. 3 depicts the overall lithography and metrology method incorporating a stability module 300 (essentially an application running on a server, in this example). Shown are three main process control loops, labeled LP1, LP2, LP3. The first loop LP1 provides recurrent monitoring for stability control of the lithography apparatus using the stability module 300 and monitor wafers. Immediately after a lithographic apparatus calibration, a baseline wafer or wafer set is exposed on the lithographic apparatus or scanner 310 and measured by a metrology tool 315 to set baseline parameters e.g., for focus and/or overlay (e.g., the scanner's overlay and/or focus baseline fingerprints). At a later time (e.g., periodically), a monitor wafer 305 is exposed on scanner 310 and measured by metrology tool 315. The stability module 300 compares the parameters from the monitor wafer 305 measurements (e.g., the scanner's present overlay and/or focus fingerprints) and compares these to the (stored) baseline parameters. Based on the comparison, stability module 300 calculates correction routines 350 to correct for drift in these parameters which is fed back to the scanner 310 and used when performing further exposures. This can be repeated periodically to control scanner drift, e.g., to determine corrections which return the scanner operation to (or near) the baseline parameters. The exposure of the monitor wafer may involve printing a pattern of marks on top of reference marks. By measuring overlay error between the top and bottom marks, deviations in performance of the lithographic apparatus can be measured, even when the wafers have been removed from the apparatus and placed in the metrology tool. Such monitor wafer may also comprise focus marks for monitoring of focus.

In some embodiments, the monitor wafers are dedicated to a particular lithographic apparatus. In other embodiments, a "golden reference" baseline monitor wafer is defined which can be used for all lithographic apparatuses, along with an associated difference set to adapt the baseline parameters for each individual lithographic apparatus. The stability module 300 calculates the difference (as a difference set or correction set) between the golden reference wafer and a standard monitor wafer exposed on each scanner. The standard monitor wafer plus the difference set acts as a new copy of the reference. In this manner, every scanner in a fabrication site (fab), regardless of scanner type or model and of grid differences, can be matched to this golden reference, increasing fab efficiency significantly.

The second (APC) loop is for local scanner control on-product (determining focus, dose, and overlay on product wafers). The exposed product wafer 320 is passed to metrology unit 315 where information relating for example to parameters such as critical dimension, sidewall angles and overlay is determined and passed onto the Advanced Process Control (APC) module 325. This data is also passed to the stability module 300. Process corrections 340 are made before the Manufacturing Execution System (MES) 335 takes over, providing control of the scanner 310, in communication with the scanner stability module 300.

The third control loop is to allow metrology integration into the second (APC) loop (e.g., for double patterning). The post etched wafer 330 is passed to metrology unit 315 which again measures parameters such as critical dimensions, sidewall angles and overlay, read from the wafer. These parameters are passed to the Advanced Process Control (APC) module 325. The loop continues the same as with the second loop.

Figure 4:
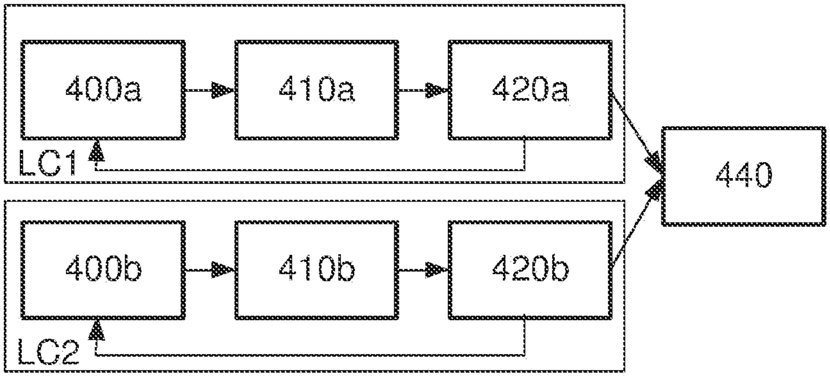
FIG. 4 is a flow diagram describing a present method of manufacturing integrated devices which utilizes wafer-to-wafer bonding.

FIG. 4 shows a device manufacturing arrangement for making bonded substrates (and therefore ICs based on bonded substrates) comprising a first manufacturing lithocell LC1 and a second manufacturing lithocell LC2. Within each lithocell is a pair of lithographic processing systems 400*a*, 400*b* and first metrology systems 410*a*, 410*b*. The lithographic processing system 400*a*, 400*b*, may comprise a full patterning system Such a system may comprise, for example, an optical lithographic apparatus or scanner such as described in respect of FIG. 1, a track tool, a deposition tool, an etch tool, any other apparatus used in the patterning process, or any combination selected therefrom. The systems may also each comprise a software application 420*a*, 420*b* in communication with its respective lithographic processing system 400*a*, 400*b* and metrology system 410*a*, 410*b*, so that results, designs, data, etc. of the lithographic processing system 400*a*, 400*b* and/or the metrology apparatus 410*a*, 410*b* may be stored and analyzed by the software application 420*a*, 420*b* at the same time or different times.

Once pairs of substrates or wafers are completed from each of lithocell LC1 and lithocell LC2, they may be bonded within a bonding tool 440 to obtain a bonded wafer. Bonding in this context is wafer-to-wafer bonding where whole wafers are aligned and bonded together such that individual dies on each wafer are aligned. The concept of wafer-to-wafer bonding is known and used in many IC manufacturing processes. The bonding tool 440 may comprise a bonding alignment device for aligning the wafers together for bonding. For example, the bonding tool 440 may perform pre-align using box-in-box marks provided to wafers (e.g., one box on each wafer), with visual inspection of marks used for alignment quality/position control. Another method uses two imaging sensors (e.g., face to face) which are first calibrated together to find their relative positions; each sensor is then used to separately align a respective wafer to be bonded.

Lithocell LC1 and lithocell LC2 may be the same lithocell, different lithocells but comprising one or more shared tools and elements, or be completely different lithocells having completely different sets of apparatuses and tools, possibly even at different sites or fabs. For example, one or more of the tools or apparatuses of the lithographic processing systems 400*a* and 400*b* may comprise different tools or the same tools within each respective system. Similarly metrology apparatuses 410 and 410*b* may be the same apparatus or different apparatuses. The software application 420*a*, 420*b* may be comprised within one or both of the respective lithographic processing systems 400*a*, 400*b* and/or one or both of the first metrology systems 410*a*, 410*b*, or elsewhere.

As mentioned above, the lithographic processing system 400*a*, 400*b* may be configured to include the lithographic apparatus LA in FIG. 1. The lithographic processing system 400*a*, 400*b* may be setup for executing the patterning aspect of the patterning process and optionally, may be configured to correct for deviations occurring within the lithographic processing system 400*a*, 400*b* or in one or more other processes or apparatuses in the patterning process. The lithographic processing system 400*a*, 400*b* may be able to apply a correction of an error (e.g., imaging error, focus error, dose error, etc.) by adjusting one or more modification apparatuses of the lithographic processing system 400*a*, 400*b*. That is, correction may be made by any manufacturing processing tool in the lithographic processing system 400*a*, 400*b* that can purposefully modify a patterning error. In present systems, however, these corrections (scanner corrections and other processing tool corrections) do not take into account any of the bonding processes performed by the bonding tool 440.

For example, the correction of an error can be made by adjusting one or more modification apparatuses of the lithographic apparatus, e.g., by employing the adjustment mechanism AM to correct for or apply an optical aberration, by employing the adjuster AD to correct or modify an illumination intensity distribution, by employing the positioner PM of the patterning device support structure MT and/or the positioner PW of the wafer table WT to correct or modify the position of the patterning device support structure MT and/or the wafer table WT respectively, etc. Where, for example, the lithographic processing system 400*a*, 400*b* comprises a track tool, correction of an error can be made by adjusting one or more modification apparatuses of the track tool, e.g., modifying a bake temperature of a bake tool of the track, modifying a development parameter of a development tool of the track, etc. Similarly, where, for example, the lithographic processing system 400*a*, 400*b* comprises an etch tool, correction of an error can be made by adjusting one or more modification apparatuses of the etch tool, e.g., modifying an etch parameter, such as etchant type, etchant rate, etc. Similarly, where, for example, the lithographic processing system 400*a*, 400*b* comprises a planarization tool, correction of an error can be made by adjusting one or more modification apparatuses of the planarization tool, e.g., modifying a planarization parameter. Similarly, where, for example, the lithographic processing system 400*a*, 400*b* comprises a deposition tool, correction of an error can be made by adjusting one or more modification apparatuses of the deposition tool, e.g., modifying a deposition parameter.

One or more modification apparatuses of the lithographic processing system 400*a*, 400*b* may be able to apply up to third order polynomial correction of errors (e.g., imaging error, focus error, dose error, etc.).

The metrology apparatus 410*a*, 410*b* may be configured to obtain measurements related to wafers printed with patterns by the lithographic processing system 400*a*, 400*b*. The metrology apparatus 410*a*, 410*b* may be configured to measure or determine one or more parameters (e.g., overlay error, dose, focus, CD, etc.) of the patterns printed by the lithographic processing system 400*a*, 400*b*. The metrology apparatus 410*a*, 410*b* may be a diffraction-based overlay metrology tool that can measure, e.g., overlay, critical dimension and/or other parameters. The metrology apparatus 410*a*, 410*b* may be an alignment apparatus used to measure relative position between two objects, such as between a patterning device and a wafer. The metrology apparatus 410*a*, 410*b* may be a level sensor to measure a position of a surface, e.g., a height and/or rotational position of a wafer surface. The metrology apparatus 410*a*, 410*b* may be a plurality of metrology apparatuses including any combination of these devices.

The metrology apparatus 410*a*, 410*b* may measure and/or determine one or more values of one or more parameters (e.g., overlay error, CD, focus, dose, etc.) associated with an error in the patterning process. After the metrology apparatus 410*a*, 410*b* finishes the measurement or determination, the software application 420*a*, 420*b* creates modification information based on the measurement data (e.g., overlay error, CD, focus, dose, etc.). The software application 420*a*, 420*b* may evaluate the one or more values of the one or more parameters to determine if they are within a tolerance range. If not, the software application 420*a*, 420*b* determines modification information to correct an error reflected by the out of tolerance one or more values of the one or more parameters. The software application 420*a*, 420*b* may use one or more mathematical models to determine error correctable by one or more modification apparatuses of the lithographic processing system 400*a*, 400*b* and to provide information for one or more parameters (e.g. modification information) of the one or more modification apparatuses of the lithographic processing system 400*a*, 400*b*, which one or more parameters enable configuration of the one or more modification apparatuses of the lithographic processing system 400*a*, 400*b* to correct (e.g., eliminate or reduce to within a tolerance range) the error. One or more of the mathematical models may define a set of basis functions that fit the data once parameterized. The one or more mathematical models may comprise a model configured to simulate correctable error for the lithographic processing system 400*a*, 400*b*. The model may specify a range of modifications that one or more of the modification apparatuses of the lithographic processing system 400*a*, 400*b* can make and determines correctable error within the range. That is, the range may specify an upper limit, a lower limit, and/or both on the amount of modifications that a particular modification apparatus of the lithographic processing system 400*a*, 400*b* can make.

There are a number of drawbacks with the method described in relation to FIG. 4. Present scanner control methods are unaware of, and therefore do not take into account of, potential bonding steps with other wafers. Wafers may be bonded together which have incompatible or poorly optimized grids/shapes/dead die locations. For example, a first wafer may have a bowl shaped fingerprint with dead (or out of spec) dies being found at the edge and a second wafer may have a fingerprint with the inverse bowl shape such that dead dies are found near the center. Bonding of these wafers would be sub-optimal and wasteful compared to bonding wafers which have similar fingerprints. For bonding use cases a wafer may be paired with another wafer having a specific grid which is not necessarily matched to the grid of the current wafer.

A number of methods will now be described to improve upon present manufacturing techniques which use wafer to wafer bonding of two or more wafers together. The methods comprise the following:

- Overlay feedforward correction of a bonding fingerprint induced by wafer bonding-process;
- Co-optimization of correction capabilities of scanner and wafer bonder control capabilities;
- Application of reference scanner monitoring wafer to enable grid matching of to-be-bonded wafers;
- Yield-aware correction and prediction by application of computational metrology approach;
- A diffraction based bonding alignment method and associated mark structure.

Figure 5:
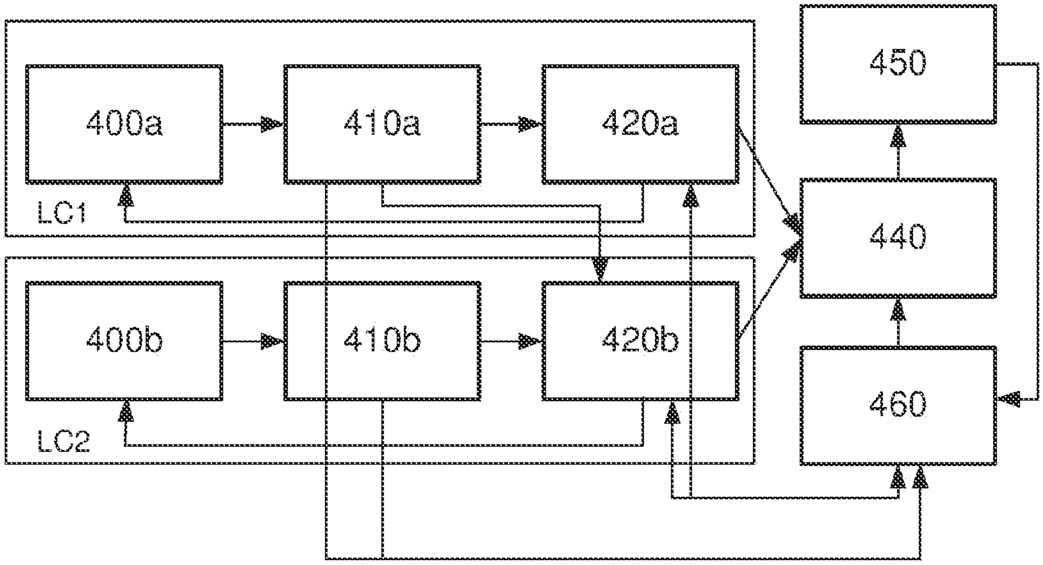
FIG. 5 is a flow diagram describing methods according to embodiments of the invention for manufacturing integrated devices which utilize wafer-to-wafer bonding.

FIG. 5 is a flow diagram which illustrates examples of the first four of these concepts in a single flow. However, it should be appreciated that all five of these concepts can be implemented individually, and/or a method disclosed herein may comprise any two or more in any combination. Each concept will now be described individually. The flow diagram of FIG. 5 is based upon that of FIG. 4, and the same elements have the same labels and therefore will not be necessarily described further. As represented in FIG. 5, the bonding apparatus 440 may have an associated bonding metrology tool 450 and bonding software application 460. As before, the bonding metrology tool 450 may be separate to the other metrology tools in the Figure, or it may be that the same metrology tool is represented by any two or all three of metrology tools 450, 410*a*, 410*b*. Similarly, the software application 460 may be the same (or run on the same apparatus) as one or both of software applications 420*a*, 420*b*, and may be run on any of the apparatuses represented in the Figure, and/or one or more separate processing apparatuses (not shown). Also note that the description below describes the bonding process as that bonding two wafers. However, the concepts are equally applicable to bonding of more than two wafers, and as such any reference to terms such as "wafer pair" is to be understood to encompass sets of wafers greater than 2, which are to be bonded together.

As with FIG. 4, lithocell LC1 and lithocell LC2 may be the same lithocell, different lithocells but comprising one or more shared tools and elements, or be completely different lithocells having completely different sets of apparatuses and tools, possibly even at different sites or fabs.

Overlay Feedforward Correction of a Bonding Fingerprint Induced by Wafer Bonding-Process In this embodiment, it is proposed to measure the across wafer parameter (e.g., overlay) fingerprint after bonding, and using this fingerprint as an input for determining a correction or optimization for the bonding process for bonding of subsequent wafers. For example, after bonding of first and second wafers W1, W2, the fingerprint may be measured by metrology tool 450 and a correction or bonding optimization determined by software application 460 for the bonding third and fourth wafers W3 and W4. The correction may be determined based also on the individual fingerprints of each wafer (e.g., as measured by metrology tools 410*a*, 410*b*), such that software application deduces the bonding tool fingerprint contribution from the final bonded fingerprint and the two pre-bonding wafer fingerprints. The software application 460 can than actively actuate (e.g., via a correction and/or optimization) the bonding tool 440 to optimize overlay for bonding the next wafer pair. Therefore, this concept may be represented in FIG. 5, by the loop of elements 440, 450, 460 and the feedforward of data from metrology devices 410*a*, 410*b* to software application 460.

In an embodiment, this method may be implemented within and by the APC control loop (e.g., loop LP2 of FIG. 3). In an embodiment, the feedforward may be more comprehensive (e.g. via APC controller or otherwise) by taking a larger set of historic overlay data (pre-bonding and post-bonding fingerprints) into account; e.g., to prevent unstable control (for example, where the fingerprint data for an immediately preceding wafer pair is non-representative of the process generally).

Co-Optimization of Correction Capabilities of Scanner and Wafer Bonder Control Capabilities Based on knowledge of the bonding tool fingerprint (e.g., using methods described in the previous embodiment) co-optimized corrections for the bonding tool fingerprint and one or both of the scanner fingerprints can be determined. The co-optimization may therefore determine co-optimized corrections for one or both exposure processes for each wafer pair to be bonded and for the bonding process, which together minimize overlay in the final bonded wafer. The co-optimization may also include corrections for other tools, such as an etching tool (which also induces its own fingerprint contribution). It can be appreciated, for example, that such a co-optimization method may actually worsen overlay (or even dies-in-spec) for one or both of the unbonded wafers, but in a manner which minimizes overlay across the bonded wafer and/or maximizes dies-in spec of the bonded wafer. Any co-optimization strategy may be used, including a die-in-spec co-optimization, a max-abs optimization, a least-squares co-optimization or any other suitable optimization. Co-optimization concepts are described, for example, in US2018/0252998 and WO2019/110261 both of which are incorporated herein by reference. Any of the co-optimization concepts described herein, but extended to the bonding process is envisaged in this embodiment.

For example, the co-optimization may comprise controlling the bonding tool and one or both scanner fingerprints such that the scanner corrections pre-correct for the bonding tool contribution to the overall bonded wafer overlay fingerprint. For example, such an optimization may comprise finding scanner and/or bonding tool (and/or etch tool or other tool) corrections which minimize the difference between the second wafer (pre-bonding) fingerprint and the sum of the first wafer (pre-bonding) fingerprint and the bonding tool fingerprint (for a to-be-bonded wafer pair of the first wafer and second wafer). The co-optimization may also include co-optimizing a patterning device or reticle pattern (e.g., via a reticle patterning apparatus) used for patterning the first and/or second wafer.

Such a co-optimization may be based on the correction capabilities of the relevant tools (e.g., scanners, bonding tool and/or etch tool), so as to distribute the correction across these tools to achieve lowest non-correctable error (NCE) for the parameter of interest (e.g., overlay); e.g., using a pattern fidelity control (PFC) type approach. This distribution between scanner and bonder (and possible other tool) correction capabilities can be based, not only on the type of correction capability (e.g., per spatial frequency, order, field), but also on the range of this correction capability. By way of specific example, by adding an offset to the scanner actuation, the resulting fingerprint can be brought closer to the center of the correction range of the bonding tool (or vice versa). Such concepts are described, for example in the aforementioned US2018/0252998.

In such an embodiment, the co-optimization may comprise (e.g., using one or more mathematical models) determining an error correctable by one or more apparatuses of the lithographic processing systems 400*a*, 400*b* and/or the bonding tool 440, and adding an offset (e.g., deliberate error) to one of the processes performed by one of these apparatuses (or to the reticle pattern itself). For example, the offset may result in a transformation of a non-correctable error by an apparatus of the lithographic processing systems 400*a*, 400*b* or bonding tool 440 to a correctable error by one or more other apparatuses of the lithographic processing systems 400*a*, 400*b*, the bonding tool 440 and/or the reticle pattern. As an example of such transformation, an error having an uncorrectable spatial resolution for a particular apparatus of one or both lithographic processing systems 400*a*, 400*b* and/or bonding tool 440 can be enabled for correction by adding further error such that the total error has a spatial resolution correctable by the apparatus of one or both lithographic processing systems 400*a*, 400*b* and/or bonding tool 440. In an embodiment, the added error may be divided among a plurality of the relevant apparatuses and/or the reticle pattern (e.g., via a reticle modification tool).

The co-optimization may further comprise determining a control recipe for one or both of the first lithographic processing system 400*a* and lithographic processing system 400*b* from a first control grid (e.g., measured using a scatterometer and/or alignment sensor) associated with the first lithographic processing system 400*a* and a second control grid (e.g., measured using a scatterometer and/or alignment sensor) associated with the second lithographic processing system 400*b* so as to optimize matching of first control grid and second control grid.

Reference Scanner Monitoring Wafer to Enable Grid Matching of to-be-Bonded Wafers The concept of scanner stability monitoring using monitor wafers was described above in combination with FIG. 3 (loop LP1). It is proposed that similar methods be used to match the control grids for each wafer of a wafer pair (or larger wafer set). As already stated, the first and second wafers may come from different scanners 400*a*, 400*b*. These different scanners may be located within different fabs, and may comprise completely different systems or platforms (e.g., one might be an EUV scanner and another may be a DUV scanner). As such, the scanners may comprise completely different control and alignment strategies and therefore may have different, incompatible, control grid definitions. While this scanner grid difference may be budgeted for in the overall overlay budget of the bonded wafers, its impact may be reduced or minimized by using a common grid definition.

In a first implementation, this may be achieved by using matched or copied monitor wafers such as those already described. A suitable processing module (e.g. a module such as stability module 300, which may be represented in FIG. 5 by software application 460) may calculate the difference (as a difference set or correction set) between a golden reference wafer and a standard monitor wafer exposed on each scanner. The respective monitor wafers plus the difference sets will be matched, so as to define a common grid which may be used as the control grid for the bonding process by bonding tool 440.

Figure 6:
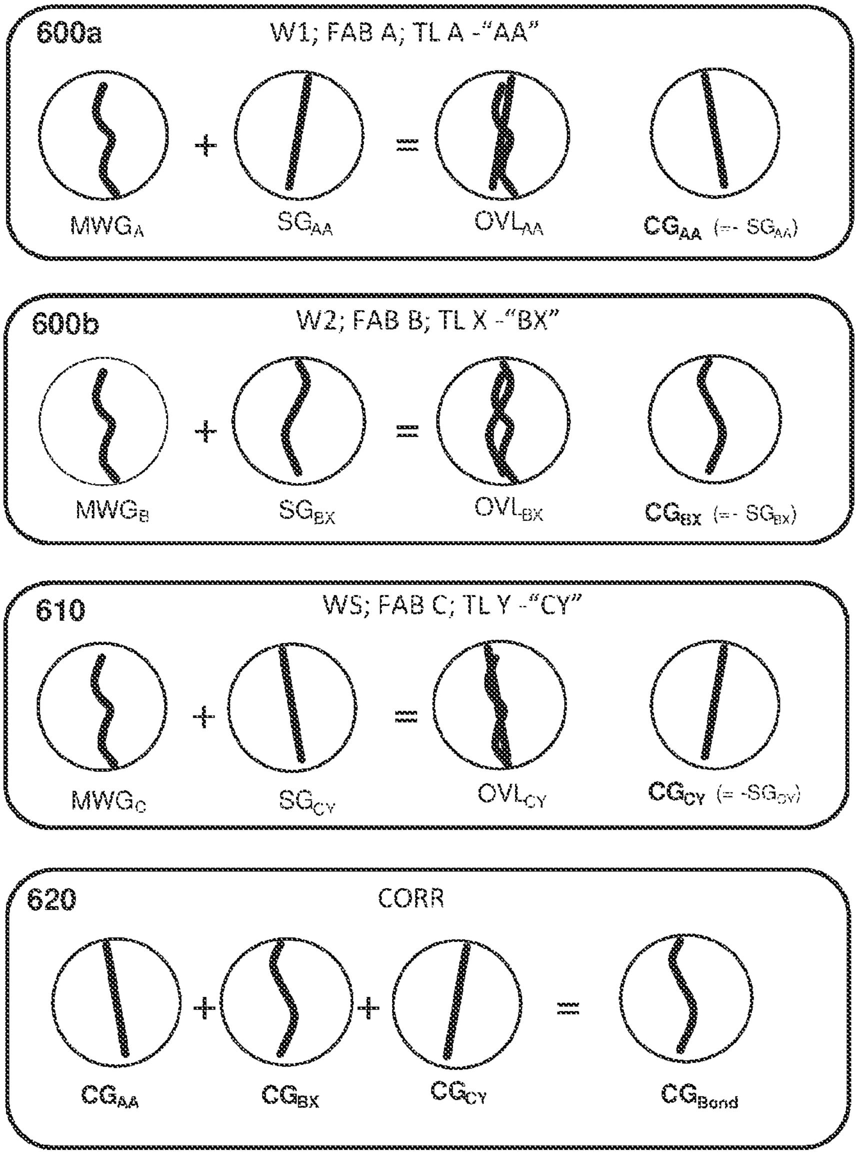
FIG. 6 illustrates a flow for a further implementation for determining a post-bonding lithography correction according to an embodiment of the invention.

FIG. 6 illustrates a flow for a further implementation for determining a post-bonding lithography correction of a grid delta (grid difference) between the grids of the bonded wafers using the delta of monitor wafer grids. After bonding and grinding/thinning the top silicon substrate, the post-bonding lithography layers may be a target for overlay improvement. Such a method controls delta/drift of grids in wafer stack by controlling them with respect to a monitor wafer grid. The method assumes that there is a single set of matched monitor wafers for each fab or scanner involved in manufacturing a wafer for the wafer stack and for the post bonding lithography. Alternatively, if this is not possible or feasible, a calculated delta grid (correction set) between the monitor wafers can be added to the process flow (e.g., at step 620 of the illustrated flow).

Step 600*a* relates to a first fab, FAB A comprising a first scanner, TL A on which a first wafer W1 is to be processed. A monitor wafer (e.g., from the matched set) has had a monitor wafer grid $MWG_A$ exposed thereon. Following this, the scanner TL A is used in to perform a lithography step on the monitor wafer, imposing thereon its respective scanner grid $SG_{AA}$. The monitor wafer is then measured to obtain the overlay fingerprint $OVL_{AA}$ resultant from both grids. Based on this a correction grid is $CG_{AA}$ is determined (e.g., as the inverse of the scanner grid $SG_{AA}$).

Step 600*b* relates to a second fab, FAB B comprising a second scanner, TL X on which a second wafer W2 is to be processed. A monitor wafer (e.g., from the matched set) has had a monitor wafer grid $MWG_B$ exposed thereon. Following this, the scanner TL X is used in to perform a lithography step on the monitor wafer, imposing thereon its respective scanner grid $SG_{BX}$. The monitor wafer is then measured to obtain the overlay fingerprint $OVL_{BX}$ resultant from both grids. Based on this a correction grid is $CG_{BX}$ is determined (e.g., as the inverse of the scanner grid $SG_{BX}$).

Step 610 relates to a third fab, FAB C comprising a third scanner, TL Y on which the wafer stack WS comprising bonded wafer pair W1, W2 is to be processed in a post-bonding lithography step. A monitor wafer (e.g., from the matched set) has had a monitor wafer grid $MWG_C$ exposed thereon. Following this, the scanner TL C is used in to perform a lithography step on the monitor wafer, imposing thereon its respective scanner grid $SG_{CY}$. The monitor wafer is then measured to obtain the overlay fingerprint $OVL_{CY}$ resultant from both grids. Based on this a correction grid is $CG_{CY}$ is determined (e.g., as the inverse of the scanner grid $SG_{CY}$).

At step 620, a bonding scanner correction grid $CG_{Bond}$ is determined from the correction grids $CG_{AA}$, $CG_{BX}$, $CG_{CY}$, as determined in the previous steps. For example, the bonding scanner correction grid $CG_{Bond}$ may be determined as a combination (e.g., the sum) of the correction grids $CG_{AA}$, $CG_{BX}$, $CG_{CY}$. Therefore the bonding scanner correction grid $CG_{Bond}$ may be determined as a combination (e.g., the sum) of the inverses of the related scanner grids (e.g. a combination of $-SG_{AA}$, $-SG_{BX}$, $-SG_{CY}$). The bonding scanner correction grid $CG_{Bond}$ may also include contributions from one or more calculated delta grids for respective correction grids where no suitably matched monitor wafer was used in determining the correction grid. The bonding scanner correction grid $CG_{Bond}$ may be applied when processing the wafer stack at third fab FAB C, when using scanner TL Y for post-bonding lithography. This may be accomplished by adding it to the stability module control loop at the third fab FAB C or via an external interface (e.g., controlled by a user at the third fab).

In this manner scanner grid drift (for scanners TL A, TL X, TL Y) is taken into account by updating the bonding scanner correction grid $CG_{Bond}$ at the same frequency as the scanner correction grids in each separate Fabs (e.g., every few days). It will be readily appreciated that this method can be extended to post-bonding lithography steps on bonded stacks comprising more than two wafers.

Yield-Aware Correction and Prediction by Application of Computational Metrology Approach This embodiment comprises performing computational metrology to increase dies-in-spec for the bonded dies. Such a method may comprise using or defining a software tool (which may be represented in FIG. 5 by software application 460)

A "dies-in-spec" optimization aims to maximize the number of dies that are within specification, rather than an overall or average residual across a substrate. As such, a "dies-in-spec" optimization uses prior knowledge of the product (the die layout) when optimizing the process parameter. A least squares optimization typically treats each location equally, without taking into account the die layout. Because of this, a least squares optimization may prefer a correction which "only" results in four locations being out-of-specification, but each in a different die, over a correction which has seven locations out-of-specification, but which only affect two dies (e.g., four defects in one die, three in another). However, as only a single defect will tend to render a die defective, maximizing the number of defect-free dies (i.e., dies-in-spec) is ultimately more important than simply minimizing the number of defects or average residual per substrate.

One type of dies-in-spec optimization which may comprise a maximum absolute (max abs) per die optimization. Such a max abs optimization may minimize the maximum deviation of the performance parameter from a control target. This should produce a solution, but does not prevent dies being out of spec (only attempts to minimize the number of dies-in-spec). Another dies-in-spec strategy may comprise a constraint limited strategies, where the objective (goal) is formulated in a way that comprises adding constraints to the optimization problem; e.g., such that one or more parameters or metrics are constrained within a range such that they are not permitted to be out-of-spec. Of course, there are other constraints such as the physical constraints of the systems, such as field size and constraints in what can be varied per field, slit width and constraints in what can be varied per slit, actuation constraints in how stages can physically move etc.

In an embodiment, a dies-in-spec optimization may be further improved by using a "dead dies" database. Such a database is maintained dynamically and records all instances where a die is believed to have, or is estimated will have at least one defect (e.g., using previous yield data, data form other lithographic process and/or a defocus estimation map), such that it is considered to be dead (defective). Such dead dies may then be further sacrificed in the optimization. Within the bonding tool, this may comprise minimizing the number of good dies bonded with dead dies (which effectively wastes the unbonded good dies), and/or maximizing the number of dead dies (and/or marginal dies) bonded together. Where such an optimization includes a scanner co-optimization, dead-die scarification may also be achieved by attributing a very large or limitless process window to the dead die, beyond that of the actual limits for it to be functional, so as to provide more flexibility for optimization or control for the other dies prior to bonding (e.g., in the patterning and/or etching process). This may therefore lower the likelihood of a defect in another die in an optimization for that same layer, or for successive layers, thereby further maximizing the number of dies-in-spec.

The method of this embodiment may comprise using wafer characteristics (grids/shapes (e.g., from levelling and/or alignment data)/dead dies) as an input and calculating the combinations (e.g., wafer pairs) which provide the overall highest yield. This is a specific case of using yield prediction techniques (yield aware correction). In addition, the correction capabilities and individual bonding tool fingerprints may be taken into account to provide a preferred routing: e.g., which wafers should go to which bonding tool and/or which control recipe should be used for the bonding process.

The process flow may be optimized to determine specific threads (combinations of tools used to manufacture a particular die) associated with higher yield solutions, as predicted by the wafer pair selection method/software described above. Suh a yield prediction could be further extended to identify hotspot locations (locations of critical features with a narrow process window which often limit the process window of the process). This can provide data for guided inspection (e.g., electrical test) and/or yield prediction and/or dead die identification.

A Diffraction Based Bonding Alignment Method and Associated Mark Structure

The image based marks (e.g., box-in-box) presently used to align wafers for bonding do not allow overlay to be measured with a desired accuracy. As such, a compound diffractive mark is proposed for alignment of wafers in a bonding process. An associated method may comprise providing a first component of a compound mark on the first wafer of a wafer pair and a second component of the compound mark on the second wafer of the pair. The combined compound mark can then be read/measured using a scatterometry based metrology tool such as any which can presently measure overlay (e.g., a tool which measures structure asymmetry via measurement of intensity asymmetry in complementary higher order (e.g., +1, −1) diffraction orders).

WO2015185166A1, as an example, describes how to use diffraction based marks on wafers for measuring and control of lithography overlay performance. Here, the metrology does not relate to a respective displacement of a first structure or grating in resist to a second structure or grating in underlying layer to determine overlay performance in lithography, but instead to measurement of a respective displacement between two physically defined structure or gratings (e.g., post-etch) on separate wafers, so as to control bonding overlay performance.

Figure 7:
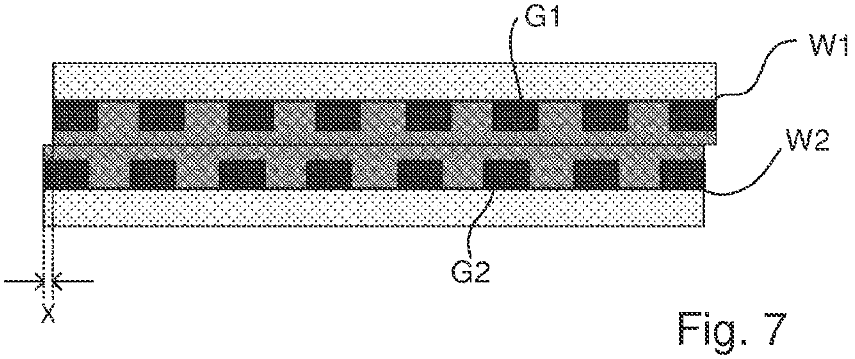
FIG. 7 is a schematic diagram of a diffractive metrology target for bonding metrology according to an embodiment of the invention.

FIG. 7 illustrates a compound diffractive mark or target for bonding metrology. It comprises a first structure or grating G1 on a first wafer W1 of a bonded pair and a second grating G2 on a second wafer W2 of the bonded pair. It should be noted that the first wafer W1 is inverted with respect to the second wafer W2; as such, the gratings are mirrored so that their interference can be used to determine bonding alignment or bonding overlay. After bonding, the two layers comprising the gratings (or layers above these) are contacted and the mark can be measured, by measuring their relative displacement X. Note that the mark design can include a multitude of layers which all can be referenced.

The relative positions of the gratings G1 and G2 may be such to define a deliberate bias to help distinguish intensity asymmetry due to misalignment from other asymmetry contributions (e.g., processing asymmetry in one or both gratings) as is known in the overlay context.

The wavelength of the metrology tool radiation used to measure should be such that the wafer is sufficiently transparent to the radiation (e.g., one or more wavelengths in the infra-red region may be used). Using such wavelengths transparent to the substrates, the metrology can be performed immediately after the wafers have been contacted, allowing for a fast rework in case the performance is insufficient.

On a suitable metrology platform (e.g., as illustrated in FIG. 2), these marks can be used to measure high density overlay fingerprints, as these small marks can be spread across the wafer at an arbitrary density. The marks may be orientated to measure overlay in both X and Y (in the substrate plane).

In certain circumstances, (e.g., single direction) measurements may be performed on metal lines, provided they have the same pitch on both wafers and are co-located. Therefore, for such a case, no additional metrology space is required.

Optionally, the covering films can be tuned for optimal contrast & accuracy.

It can be shown that the diffraction based metrology approach described here would enable overlay control with orders of magnitude better overlay metrology performance compared to the current standard image based approach.

In addition, such marks may be used to measure the local distance in Z (e.g., to verify bonding success) between the mark components based on further diffraction characteristics. This may comprise deducing this local distance in Z between the mark components based on (multi-color) diffraction spectrum or other metrology signals. This relates to the fact that, with diffraction based metrology, the distance between the two gratings has a significant impact on the returned signal. The expected signal is known (or can be inferred) from CMP control and film thickness metrology prior to bonding. Any deviations from this expected signal may be used to determine the actual film thickness between the marks. This approach can be used determine the interface as a whole. In the more extreme case where the bonding has failed at the mark location, the signal would be wildly different to that expected, due to the air bubble that will be caught between the layers. This may be used to signal that there is voiding during the bond process.

Further embodiments are disclosed by the numbered clauses below:

1. A method for controlling a process of manufacturing semiconductor devices, the method comprising:
obtaining bonded substrate metrology data comprising data relating to metrology performed on a bonded substrate, the bonded substrate comprising two or more patterned substrates bonded together; and
determining a correction for a bonding step performed to bond two or more subsequent substrates based on the bonded substrate metrology data.
2. The method of clause 1, wherein the bonded substrate metrology data comprises overlay data and the correction is for maximizing overlay and/or dies in specification of the bonded substrate.
3. The method of clause 1 or 2, wherein the step of determining a correction comprises:
obtaining first metrology data relating to a first substrate prior to bonding;
obtaining second metrology data relating to a second substrate prior to bonding; and determining bonding process contribution data from the bonded substrate metrology data, first metrology data and second metrology data, the bonding process contribution data describing the contribution to the metrology data resultant from the bonding process and/or bonding apparatus used therefor.
4. The method of clause 1, 2 or 3, wherein the step of determining a correction comprises determining the correction based on the bonded substrate metrology data and historic bonded substrate metrology data from additional earlier measured bonded substrates.
5. The method of any of clauses 1 to 4, wherein the step of determining a correction comprises determining a co-optimized correction for the bonding step and for any of the patterning processes used to manufacture the two or more patterned substrates prior to the bonding step.
6. The method of clause 5, wherein the co-optimized correction for any of the patterning processes comprise co-optimized corrections for one or more of:
a lithographic exposure process of any of the patterning processes;
a patterning device patterning process for defining the pattern on a patterning device used in any of the patterning processes; or
an etching process of any of the patterning processes.

7. The method of clause 6, wherein the co-optimized correction is determined based on the correction capabilities of one or more of the relevant tools used in the processes.
8. The method of clause 7, wherein the co-optimized correction is determined based on available ranges of the correction capabilities.
9. The method of clause 7 or 8, wherein the optimized correction distributes the correction across these tools to achieve lowest non-correctable error for a parameter of interest, such as overlay.
10. The method of any of clauses 5 to 9, wherein the co-optimization comprises determining a control action and/or setting for any of the patterning processes from metrology data related to each of the two or more patterned substrates, so as to optimize matching of control grids associated with the two or more patterned substrates.
11. The method of any preceding clause, comprising:
determining optimal pairing or grouping of substrates for the bonding step based on substrate characteristics comprising one or more of:
locations of defective dies on each substrate,
control grids,
substrate shapes.
12. The method of clause 11, wherein the determining an optimal pairing or grouping comprises predicting yield for the paired or grouped substrates and selecting the optimal pairing as that which maximizes yield.
13. The method of clause 12, wherein the results of the predicted yield are used for identification of critical locations for which process control limits are more stringent.
14. The method of clause 11, 12, or 13, further comprising taking into account characteristics of each of the available bonding tools available for the bonding step and determining allocating a bonding tool and/or control recipe therefor, for each pair or grouping of substrates based on one or both of the substrate characteristics or a processing history of each substrate.
15. The method of clause 14, wherein the method further determines a preferred routing of each substrate through the available apparatuses used for some or all of the processing steps of the corresponding patterning processes used on each substrate Further embodiments are disclosed by the numbered clauses below:

1. A method for controlling a process of manufacturing semiconductor devices, the method comprising:
determining a co-optimized correction for a bonding step performed to bond two or more substrates and for any of the patterning processes used to manufacture the two or more patterned substrates prior to the bonding step.
2. The method of clause 1, wherein the co-optimized correction for any of the patterning processes comprise co-optimized corrections for one or more of:
a lithographic exposure process of any of the patterning processes;
a patterning device patterning process for defining the pattern on a patterning device used in any of the patterning processes; or
an etching process of any of the patterning processes.
3. The method of clause 2, wherein the co-optimized correction is determined based on the correction capabilities of one or more of the relevant tools used in the processes.
4. The method of clause 3, wherein the co-optimized correction is determined based on available ranges of the correction capabilities.
5. The method of clause 3 or 4, wherein the optimized correction distributes the correction across these tools to achieve lowest non-correctable error for a parameter of interest, such as overlay.
6. The method of any of clauses 1 to 5, wherein the co-optimization comprises determining a control action and/or setting for any of the patterning processes from metrology data related to each of the two or more patterned substrates, so as to optimize matching of control grids associated with the two or more patterned substrates.
7. The method of any preceding clause, comprising:
determining optimal pairing or grouping of substrates for the bonding step based on substrate characteristics comprising one or more of:
locations of defective dies on each substrate,
control grids,
substrate shapes.
8. The method of clause 7, wherein the determining an optimal pairing or grouping comprises predicting yield for the paired or grouped substrates and selecting the optimal pairing as that which maximizes yield.
9. The method of clause 8, wherein the results of the predicted yield are used for identification of critical locations for which process control limits are more stringent.
10. The method of clause 7, 8, or 9, further comprising taking into account characteristics of each of the available bonding tools available for the bonding step and determining allocating a bonding tool and/or control recipe therefor, for each pair or grouping of substrates based on one or both of the substrate characteristics or a processing history of each substrate.
11. The method of clause 10, wherein the method further determines a preferred routing of each substrate through the available apparatuses used for some or all of the processing steps of the corresponding patterning processes used on each substrate Further embodiments are disclosed by the numbered clauses below:

1. A method for controlling a process of manufacturing semiconductor devices, the method comprising:
determining optimal pairing or grouping of substrates for a bonding step performed to bond two or more substrates based on substrate characteristics comprising two or more of:
locations of defective dies on each substrate,
control grids,
substrate shapes.
2. The method of clause 1, wherein the determining an optimal pairing or grouping comprises predicting yield for the paired or grouped substrates and selecting the optimal pairing as that which maximizes yield.
3. The method of clause 2, wherein the results of the predicted yield are used for identification of critical locations for which process control limits are more stringent.
4. The method of clause 1, 2, or 3, further comprising taking into account characteristics of each of the available bonding tools available for the bonding step and determining allocating a bonding tool and/or control recipe therefor, for each pair or grouping of substrates based on one or both of the substrate characteristics or a processing history of each substrate.

5. The method of clause 4, wherein the method further determines a preferred routing of each substrate through the available apparatuses used for some or all of the processing steps of the corresponding patterning processes used on each substrate.

Further embodiments are disclosed by the numbered clauses below:

1. A method for determining alignment of a bonded substrate stack comprising at least a first substrate and a second substrate, comprising:
illuminating a compound alignment structure comprising a first diffractive structure on the first substrate and a second diffractive structure on the second substrate;
determining relative alignment of the first substrate and the second substrate based on diffracted orders resultant from the illumination of the compound structure.
2. A method according to clause 1, wherein the determining step comprises determining the alignment based on an intensity difference between complementary higher diffraction orders resultant from the illumination of the compound structure.
3. A method according to clause 1 or 2, wherein the first diffractive structure comprises a first etched periodic structure and the second diffractive structure comprises a second etched periodic structure.
4. A method according to clause 1 or 2, wherein the first diffractive structure and the second diffractive structure each comprise a plurality of metal lines.
5. A method according to any preceding clause, wherein the first substrate and a second substrate are bonded together with one of the substrates inverted and its respective diffractive structure reversed, with respect to the other.
6. A method according to any preceding clause, wherein the first substrate and second substrate are substantially transparent to the illumination used in the illuminating step.
7. A method according to any preceding clause, comprising determining a description of the relative alignment as a function of location over the bonded substrate stack from a plurality of the compound alignment structures.
8. A method according to any preceding clause, comprising measuring the local distance in a direction perpendicular to the substrate plane between the first diffractive structure and second diffractive structure based on diffraction characteristics from the compound alignment structure with respect to expected diffraction characteristics, to quantify bonding quality.

Further embodiments are disclosed by the numbered clauses below:

1. A bonded substrate stack comprising at least a first substrate and a second substrate, wherein
the first substrate comprises a first diffractive structure and the second substrate comprises a second diffractive structure, the first diffractive structure and diffractive structure being located to form a compound alignment structure on the first substrate on the second substrate from which relative alignment of the first substrate and the second substrate can be measured.
2. A bonded substrate stack according to clause 1, wherein the first diffractive structure comprises a first etched periodic structure and the second diffractive structure comprises a second etched periodic structure.
3. A bonded substrate stack according to clause 1, wherein the first diffractive structure and the second diffractive structure each comprise a plurality of metal lines.
4. A bonded substrate stack according to any preceding clause, wherein the first substrate and a second substrate are bonded together with one of the substrates inverted and its respective diffractive structure reversed, with respect to the other.
5. A bonded substrate stack according to any preceding clause, comprising a plurality of the compound alignment structures formed by plural first and second diffractive structures over an extent of the respective substrate surfaces.

Further embodiments are disclosed by the list of numbered clauses below:

1. A method for controlling a process of manufacturing semiconductor devices, the method comprising:
obtaining first monitoring data from recurrent monitoring for stability control of a first lithographic apparatus used for a first patterning process for patterning a first substrate, the first monitoring data defining a first control grid;
obtaining second monitoring data from recurrent monitoring for stability control of a second lithographic apparatus used for a second patterning process for patterning a second substrate, the second monitoring data defining a second control grid; and
based on the first monitoring data and second monitoring data, determining a common control grid definition for a bonding step for bonding the first substrate and second substrate to obtain a bonded substrate.
2. A method according to clause 1, wherein the first monitoring data comprises an associated first difference data set customizing the first monitoring data for the first lithographic apparatus with respect to a common reference monitoring data set and the second monitoring data comprises an associated second difference data set customizing the second monitoring data for the second lithographic apparatus with respect to the common reference monitoring data set.
3. A method according to clause 1 or 2, wherein the step of determining a common control grid definition comprises determining a common control grid definition which optimizes a parameter of interest and/or dies in specification for the bonded substrate.
4. A method according to any preceding clause, comprising:
obtaining third monitoring data from recurrent monitoring for stability control of a third lithographic apparatus used for a third patterning process for patterning the bonded first and second substrates in a post bonding lithography step, the third monitoring data defining a third control grid;
determining a first correction grid from the first monitoring data, a second correction grid from the second monitoring data and third correction grid from the third monitoring data; and
determining a post-bond correction for subsequent post-bonding metrology on stacks using the third lithographic apparatus, the stacks comprising a first substrate processed on the first lithographic apparatus and a second substrate processed on the second apparatus.
5. A method according to clause 4, wherein either:
the first monitoring data, the second monitoring data and the third monitoring data are each obtained using respective monitor substrates, each of these monitoring substrates having been matched such that the first control grid, second control grid and third control grid are all matched; or the determining a post-bond correction comprises also using additional correction sets to match the first control grid, second control grid and third control grid.

6. A method according to clause 4 or 5, wherein the a first correction grid, a second correction grid and third correction grid comprise an inverse grid of respectively a first lithographic apparatus grid imposed by the first lithographic apparatus, a second lithographic apparatus grid imposed by the second lithographic apparatus and a third lithographic apparatus grid imposed by the third lithographic apparatus.

7. A method according to any preceding clause, wherein the bonding step comprises bonding more than two substrates together, each of the additional substrates comprising associated monitoring data defining a control grid, and the step of determining a common control grid definition comprises determining a common control grid definition for all of the substrates based on all of the associated monitoring data.

8. A method according to any preceding clause, further comprising:

obtaining bonded substrate metrology data comprising data relating to metrology performed on the bonded substrate; and determining a correction for performance of the bonding step on subsequent substrates based on the bonded substrate metrology data.

9. A method according to clause 8, wherein the bonded substrate metrology data comprises overlay data and the correction is for maximizing overlay and/or dies in specification of the bonded substrate.

10. A method according to clause 8 or 9, wherein the step of determining a correction comprises:

obtaining first metrology data relating to the first substrate prior to bonding;

obtaining second metrology data relating to the second substrate prior to bonding; and determining bonding process contribution data from the bonded substrate metrology data, first metrology data and second metrology data, the bonding process contribution data describing the contribution to the metrology data resultant from the bonding process and/or bonding apparatus used therefor.

11. A method according to clause 10, wherein the step of determining a correction comprises determining the correction based on the bonded substrate metrology data and historic bonded substrate metrology data from additional earlier measured bonded substrates.

12. A method according to any of clauses 8 to 11, wherein the step of determining a correction comprises determining a co-optimized correction for the bonding step and for one or both of the first patterning process and/or second patterning process.

13. A method according to clause 12, wherein the co-optimized correction for the first patterning process and/or second patterning process comprise co-optimized corrections for one or more of:

a lithographic exposure process of the first patterning process and/or second patterning process;

a patterning device patterning process for defining the pattern on a patterning device used in the first patterning process and/or second patterning process; or an etching process of the first patterning process and/or second patterning process.

14. A method according to clause 12 or 13, wherein the co-optimized correction is determined based on the correction capabilities of one or more of the relevant tools or apparatuses used in the processes.

15. A method according to clause 14, wherein the co-optimized correction is determined based on available ranges of the correction capabilities.

16. A method according to clause 14 or 15, wherein the co-optimized correction distributes the correction across these tools or apparatuses to achieve lowest non-correctable error for the parameter of interest.

17. A method according to clause 16, wherein the parameter of interest is overlay.

18. A method according to any of clauses 9 to 17, wherein the co-optimization comprises determining a control action and/or setting for one or both of the first patterning process and second patterning process from the first metrology data and second metrology data, so as to optimize matching of first control grid and second control grid.

19. A method according to any preceding clause, comprising determining optimal pairings or groupings of substrates for the bonding step based on substrate characteristics including one or more of:

locations of defective dies on each substrate, control grids, substrate shapes.

20. A method according to clause 19, wherein the determining an optimal pairing or grouping comprises predicting yield for the paired or grouped substrates and selecting the optimal pairing as that which maximizes yield.

21. A method according to clause 20, wherein the results of the predicted yield are used for identification of critical locations for which process control limits are more stringent.

22. A method according to clause 19, 20 or 21, further comprising taking into account characteristics of each of the available bonding tools available for the bonding step and allocating a bonding tool and/or control recipe therefor, for each pair or grouping of substrates based on one or both of the substrate characteristics or a processing history of each substrate.

23. A method according to clause 22, wherein the method further determines a preferred routing of each substrate through the available apparatuses used for some or all of the processing steps of the corresponding patterning processes used on each substrate.

24. A method according to any preceding clause, comprising performing the bonding step based on the common grid definition.

25. A method according to clause 24, comprising determining alignment of the subsequent bonded substrate stack, by:

illuminating a compound alignment structure comprising a first diffractive structure on the first substrate and a second diffractive structure on the second substrate; and determining relative alignment of the first substrate and the second substrate based on diffracted orders resultant from the illumination of the compound structure.

26. A method according to clause 25, wherein the determining step comprises determining the alignment based on an intensity difference between complementary higher diffraction orders resultant from the illumination of the compound structure.

27. A method according to clause 25 or 26, wherein the first diffractive structure comprises a first etched periodic structure and the second diffractive structure comprises a second etched periodic structure.

28. A method according to clause 25 or 26, wherein the first diffractive structure and the second diffractive structure each comprise a plurality of metal lines.

29. A method according to any of clauses 22 to 28, wherein the first substrate and a second substrate are bonded together with one of the substrates inverted and its respective diffractive structure reversed, with respect to the other.

30. A method according to any of clauses 22 to 29, wherein the first substrate and second substrate are substantially transparent to the illumination used in the illuminating step.

31. A method according to any of clauses 22 to 30, comprising determining a description of the relative alignment as a function of location over the bonded substrate stack from a plurality of the compound alignment structures.

32. A method according to any of clauses 22 to 31, comprising measuring the local distance in a direction perpendicular to the substrate plane between the first diffractive structure and second diffractive structure based on diffraction characteristics from the compound alignment structure with respect to expected diffraction characteristics, to quantify bonding quality.

33. A lithographic apparatus which is configured to provide product structures to a substrate in a lithographic process and a bonding apparatus configured to bond processed substrates; further comprising a processor operable to optimize control of the lithographic apparatus and/or bonding apparatus during a manufacturing process by performing the method of any preceding clause.

34. A computer program comprising program instructions operable to perform the method of any of clauses 1 to 32, when run on a suitable apparatus.

35. A non-transient computer program carrier comprising the computer program of clause 34.

Further embodiments are disclosed by the list of numbered clauses below:

1. A method for controlling a process of manufacturing semiconductor devices, the method comprising:
   obtaining a first control grid associated with a first lithographic apparatus used for a first patterning process for patterning a first substrate;
   obtaining a second control grid associated with a second lithographic apparatus used for a second patterning process for patterning a second substrate; and
   based on the first control grid and second control grid, determining a common control grid definition for a bonding step for bonding the first substrate and second substrate to obtain a bonded substrate.

2. A method according to clause 1, wherein the first control grid is defined based on first monitoring data from recurrent monitoring for stability control of the first lithographic apparatus and the second control grid is defined based on second monitoring data from recurrent monitoring for stability control of the second lithographic apparatus.

3. A method according to clause 2, wherein the first monitoring data comprises an associated first difference data set customizing the first monitoring data for the first lithographic apparatus with respect to a common reference monitoring data set and the second monitoring data comprises an associated second difference data set customizing the second monitoring data for the second lithographic apparatus with respect to the common reference monitoring data set.

4. A method according to clause 1, 2 or 3, wherein the step of determining a common control grid definition comprises determining a common control grid definition which optimizes a parameter of interest and/or dies in specification for the bonded substrate.

5. A method according to any of clauses 1 to 4, comprising:
   obtaining a third control grid of a third lithographic apparatus used for a third patterning process for patterning the bonded substrate in a post bonding lithography step;
   determining a first correction grid from the first control grid, a second correction grid from the second control grid and a third correction grid from the third control grid; and
   determining a post-bond correction for subsequent post-bonding metrology on stacks using the third lithographic apparatus, the stacks comprising a first substrate processed on the first lithographic apparatus and a second substrate processed on the second apparatus.

6. A method according to clause 2, comprising:
   obtaining third monitoring data from recurrent monitoring for stability control of a third lithographic apparatus used for a third patterning process for patterning the bonded first and second substrates in a post bonding lithography step, the third monitoring data defining a third control grid;
   determining a first correction grid from the first monitoring data, a second correction grid from the second monitoring data and third correction grid from the third monitoring data; and
   determining a post-bond correction for subsequent post-bonding metrology on stacks using the third lithographic apparatus, the stacks comprising a first substrate processed on the first lithographic apparatus and a second substrate processed on the second apparatus.

7. A method according to clause 6, wherein either:
   the first monitoring data, the second monitoring data and the third monitoring data are each obtained using respective monitor substrates, each of these monitoring substrates having been matched such that the first control grid, second control grid and third control grid are all matched; or
   the determining a post-bond correction comprises also using additional correction sets to match the first control grid, second control grid and third control grid.

8. A method according to clause 6 or 7, wherein the first correction grid, the second correction grid and third correction grid comprise an inverse grid of respectively a first lithographic apparatus grid imposed by the first lithographic apparatus, a second lithographic apparatus grid imposed by the second lithographic apparatus and a third lithographic apparatus grid imposed by the third lithographic apparatus.

9. A method according to any of clauses 2 to 8, wherein the bonding step comprises bonding more than two substrates together, each of the additional substrates comprising associated monitoring data defining a control grid, and the step of determining a common control grid definition comprises determining a common control grid definition for all of the substrates based on all of the associated monitoring data.

10. A method according to any preceding clause, further comprising:
obtaining bonded substrate metrology data comprising data relating to metrology performed on the bonded substrate; and
determining a correction for performance of the bonding step on subsequent substrates based on the bonded substrate metrology data.

11. A method according to clause 10, wherein the bonded substrate metrology data comprises overlay data and the correction is for maximizing overlay and/or dies in specification of the bonded substrate.

12. A method according to clause 10 or 11, wherein the step of determining a correction comprises:
obtaining first metrology data relating to the first substrate prior to bonding;
obtaining second metrology data relating to the second substrate prior to bonding; and
determining bonding process contribution data from the bonded substrate metrology data, first metrology data and second metrology data, the bonding process contribution data describing the contribution to the metrology data resultant from the bonding process and/or bonding apparatus used therefor.

13. A method according to clause 12, wherein the step of determining a correction comprises determining the correction based on the bonded substrate metrology data and historic bonded substrate metrology data from additional earlier measured bonded substrates.

14. A method according to any of clauses 10 to 13, wherein the step of determining a correction comprises determining a co-optimized correction for the bonding step and for one or both of the first patterning process and/or second patterning process.

15. A method according to clause 14, wherein the co-optimized correction for the first patterning process and/or second patterning process comprise co-optimized corrections for one or more of:
a lithographic exposure process of the first patterning process and/or second patterning process;
a patterning device patterning process for defining the pattern on a patterning device used in the first patterning process and/or second patterning process; or
an etching process of the first patterning process and/or second patterning process.

16. A method according to clause 14 or 15, wherein the co-optimized correction is determined based on the correction capabilities of one or more of the relevant tools or apparatuses used in the processes.

17. A method according to clause 16, wherein the co-optimized correction is determined based on available ranges of the correction capabilities.

18. A method according to clause 16 or 17, wherein the co-optimized correction distributes the correction across these tools or apparatuses to achieve lowest non-correctable error for the parameter of interest.

19. A method according to clause 18, wherein the parameter of interest is overlay.

20. A method according to any of clauses 11 to 19, wherein the co-optimization comprises determining a control action and/or setting for one or both of the first patterning process and second patterning process from the first metrology data and second metrology data, so as to optimize matching of first control grid and second control grid.

21. A method according to any preceding clause, comprising determining optimal pairings or groupings of substrates for the bonding step based on substrate characteristics including one or more of:
locations of defective dies on each substrate,
control grids,
substrate shapes.

22. A method according to clause 21, wherein the determining an optimal pairing or grouping comprises predicting yield for the paired or grouped substrates and selecting the optimal pairing as that which maximizes yield.

23. A method according to clause 22, wherein the results of the predicted yield are used for identification of critical locations for which process control limits are more stringent.

24. A method according to clause 21, 22 or 23, further comprising taking into account characteristics of each of the available bonding tools available for the bonding step and allocating a bonding tool and/or control recipe therefor, for each pair or grouping of substrates based on one or both of the substrate characteristics or a processing history of each substrate.

25. A method according to clause 24, wherein the method further determines a preferred routing of each substrate through the available apparatuses used for some or all of the processing steps of the corresponding patterning processes used on each substrate.

26. A method according to any preceding clause, comprising performing the bonding step based on the common grid definition.

27. A method according to clause 26, comprising determining alignment of the subsequent bonded substrate stack, by:
illuminating a compound alignment structure comprising a first diffractive structure on the first substrate and a second diffractive structure on the second substrate; and
determining relative alignment of the first substrate and the second substrate based on diffracted orders resultant from the illumination of the compound structure.

28. A method according to clause 27, wherein the determining step comprises determining the alignment based on an intensity difference between complementary higher diffraction orders resultant from the illumination of the compound structure.

29. A method according to clause 27 or 28, wherein the first diffractive structure comprises a first etched periodic structure and the second diffractive structure comprises a second etched periodic structure.

30. A method according to clause 27 or 28, wherein the first diffractive structure and the second diffractive structure each comprise a plurality of metal lines.

31. A method according to any of clauses 24 to 30, wherein the first substrate and a second substrate are bonded together with one of the substrates inverted and its respective diffractive structure reversed, with respect to the other.

32. A method according to any of clauses 24 to 31, wherein the first substrate and second substrate are substantially transparent to the illumination used in the illuminating step.

33. A method according to any of clauses 24 to 32, comprising determining a description of the relative alignment as a function of location over the bonded substrate stack from a plurality of the compound alignment structures.

34. A method according to any of clauses 24 to 33, comprising measuring the local distance in a direction perpendicular to the substrate plane between the first diffractive structure and second diffractive structure based on diffraction characteristics from the compound alignment structure with respect to expected diffraction characteristics, to quantify bonding quality.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:

illuminating a compound alignment structure, comprising a first diffractive structure on a first substrate and a second diffractive structure on a second substrate;

determining, based on diffracted orders resultant from the illumination of the compound structure, relative alignment between the first substrate and the second substrate during, or after, bonding of the first substrate to the second substrate; and determining a distance in a direction transverse to a major plane of the substrate between the first and second diffractive structures based on diffraction characteristics from the compound alignment structure with respect to expected diffraction characteristics.

2. The method according to claim 1, wherein the determining comprises determining the relative alignment based on an intensity difference between complementary higher diffraction orders resultant from the illumination of the compound structure.

3. The method according to claim 1, wherein the first diffractive structure comprises a first etched periodic structure and the second diffractive structure comprises a second etched periodic structure.

4. The method according to claim 1, wherein the first diffractive structure and the second diffractive structure each comprise a plurality of lines.

5. The method according to claim 1, wherein the first and second substrates are bonded together with one of the substrates inverted and its respective diffractive structure reversed with respect to the other diffractive structure.

6. The method according to claim 1, wherein the first and second substrates are substantially transparent to the illumination used in the illuminating.

7. The method according to claim 1, further comprising determining a description of the relative alignment as a function of location over the bonded substrate stack from a plurality of the compound alignment structures.

8. A system comprising:

a lithographic apparatus configured to provide product structures to a substrate in a lithographic process;

a bonding apparatus configured to bond processed substrates; and a processor configured to optimize control of the lithographic apparatus and/or bonding apparatus during a manufacturing process by performing the method of claim 1.

9. The method according to claim 1, wherein the first diffractive structure and/or second structure comprises a device structure.

10. The method according to claim 1, wherein the illumination comprises infrared radiation.

11. A bonded substrate stack comprising at least a first substrate and a second substrate, wherein the first substrate comprises a first diffractive structure and the second substrate comprises a second diffractive structure facing toward, and contacting, the first diffractive structure prior to illumination for measurement, the first and second diffractive structures located to form a compound alignment structure on the first and second substrates to enable measurement of relative alignment between the first substrate and the second substrate, wherein the first diffractive structure and/or second structure comprises a device structure.

12. The stack according to claim 11, wherein the first diffractive structure comprises a first etched periodic structure and the second diffractive structure comprises a second etched periodic structure.

13. The stack according to claim 11, wherein the first diffractive structure and the second diffractive structure each comprise a plurality of lines.

14. The stack according to claim 11, wherein the first and second substrates are bonded together with one of the substrates inverted and its respective diffractive structure reversed with respect to the other diffractive structure.

15. The stack according to claim 11, further comprising one or more further compound alignment structures formed by plural first and second diffractive structures over an extent of the respective substrate surfaces.

16. A computer program product comprising a non-transitory computer-readable medium having program instructions therein, the instructions, when executed by a computer system, configured to cause the computer system to at least:

obtain a signal resultant from illuminating a compound alignment structure, comprising a first diffractive structure on a first substrate and a second diffractive structure on a second substrate;

determine, based on the signal, relative alignment between the first substrate and the second substrate; and determine a distance in a direction transverse to a major plane of the substrate plane between the first and second diffractive structures based on diffraction characteristics from the compound alignment structure with respect to expected diffraction characteristics.

17. The computer program product according to claim 16, wherein the instructions configured to cause the computer system to determine the relative alignment are configured to cause the computer system to determine the relative alignment based on diffracted order information within the signal resultant from the illumination of the compound structure.

18. The computer program product according to claim 16, wherein the instructions configured to cause the computer system to determine the relative alignment are configured to cause the computer system to determine the alignment based on an intensity difference between complementary higher diffraction orders resultant from the illumination of the compound structure.

19. The computer program product according to claim 16, wherein the instructions are further configured to cause the computer system to determine a description of the relative alignment as a function of location over the bonded substrate stack from a plurality of the compound alignment structures.

20. The computer program product according to claim 16, wherein the first and second substrates are bonded together with one of the substrates inverted and its respective diffractive structure reversed with respect to the other diffractive structure.

* * * * *